United States Patent
Tammanur Ranganathan et al.

(10) Patent No.: US 10,032,723 B2
(45) Date of Patent: Jul. 24, 2018

(54) METAL LAYER INDEPENDENT VERSION IDENTIFIER

(71) Applicant: Intel Corporation, Santa Clara, CA (US)

(72) Inventors: Karthik Tammanur Ranganathan, Singapore (SG); Jau Soon Chee, Singapore (SG); Himanshu Kukreja, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/365,224

(22) Filed: Nov. 30, 2016

(65) Prior Publication Data

US 2018/0151506 A1 May 31, 2018

(51) Int. Cl.
*H01L 23/544* (2006.01)

(52) U.S. Cl.
CPC .... *H01L 23/544* (2013.01); *H01L 2223/5444* (2013.01)

(58) Field of Classification Search
CPC .................. H01L 23/544; H01L 2223/5444

USPC .................................................. 327/564, 565
See application file for complete search history.

(56) References Cited

U.S. PATENT DOCUMENTS

| 2011/0131391 | A1* | 6/2011 | Barowski ............ G06F 15/7842 712/12 |
| 2013/0155794 | A1* | 6/2013 | Wu ...................... G11C 29/802 365/200 |

* cited by examiner

*Primary Examiner* — William Hernandez
(74) *Attorney, Agent, or Firm* — Eschweiler & Potashnik, LLC (57) ABSTRACT

Version circuitry for use with a semiconductor chip having multiple layers includes multiple status bits. The versioning circuitry includes, for each status bit, gate circuitry, first selector circuitry in a first layer, and second selector circuitry in a second layer. The gate circuitry generates a value for the status bit based at least on a first input and a second input. The first selector circuitry is coupled to the gate circuitry and is configured to select a value for the first input. The second selector circuitry is coupled to the gate circuitry and is configured to select a value for the second input. The gate circuitry generates a default value for the status bit when the first input and the second input each have a default value and generates an opposite value for the status bit when either the first input or the second input has an opposite value.

20 Claims, 5 Drawing Sheets

METAL LAYER INDEPENDENT VERSION IDENTIFIER

FIELD

The present disclosure relates to semiconductor chips (hereinafter "chip") and in particular to methods and systems for generating a version identifier for a semiconductor chip.

BACKGROUND

Semiconductor chips include a chip identifier that uniquely identifies the chip (e.g., a serial number) and a version identifier (sometimes called "IDCODE") that is common to all chips in a family. The chip identifier and version identifier are stored in designated registers so that the chip identifier and version identifier may be read to identify the chip.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Semiconductor chips include multiple layers of metal separated by layers of semiconductor material and/or layers of other types of materials that provide a desired functionality. For the purposes of this description, "metal layer" refers to a metal layer that includes interconnection features that conduct electrical signals between devices (e.g. transistors) on the semiconductor chip.

When a semiconductor chip design is revised, the version identifier is also revised (usually incremented) to reflect the fact that the design has changed. If the version identifier is generated on a metal layer that is not affected by the functional changes to the chip, an additional change to the metal layer may be necessary. This change will incur an additional mask charge. To address this problem, some chips include a dedicated e-fuse region in which fuses may be opened to revise the version identifier. However, the e-fuse solution is area and cost intensive. Further, the use of e-fuses to encode a version identifier require a fuse read operation before any boundary scan operation, which is a violation of the IEEE 1149.1 standard.

Figure 1A:
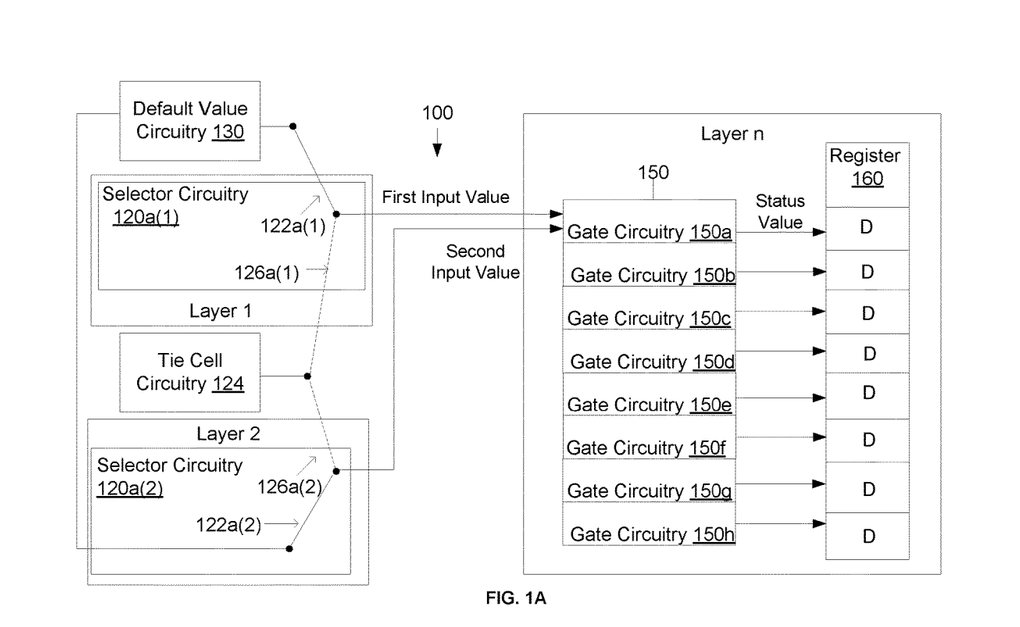
FIGS. 1A and 1B illustrate one example embodiment of versioning system that allows the version identifier to be changed from any one of multiple metal layers in the chip.

The described versioning circuitry and methods allow the chip version identifier to be changed from any metal layer in the chip. FIG. 1A illustrates a chip 100 that includes n metal layers. One layer of the chip includes a status register 160 configured to store 8 status bits, all of which are set to a default value D (i.e., either 0 or 1). The status bits encode information about a number of changes that have been made to the chip as will be described in more detail below. Each status bit value is generated by corresponding gate circuitry 150a-150h based on an input value from each layer of the chip (e.g., layer 1 and layer 2). If an input value to gate circuitry 150a from any of the layers of the chip changes, the status value generated by the gate circuitry 150a will change, thereby changing the corresponding status bit stored in the register 160.

Multiple metal layers of the chip each include selector circuitry 120 that selects the input value provided by the layer to the gate circuitry 150. In the simplified n layer chip of FIG. 1A, first selector circuitry 120a(1) is part of layer 1 and selects the first input value to the gate circuitry 150a. Second selector circuitry 120a(2) is part of layer 2 and selects the second input value to the gate circuitry 150a. The gate circuitry 150a generates the status value based at least on the first input value and the second input value.

Each selector circuitry 120 includes a first connection 122 between default value circuitry 130 and the gate circuitry 150. The first connection 122 can be broken or opened by changing only the layer in which the selector circuitry 120 resides. The default value circuitry 130 is configured to generate a default input value (e.g., either 0 or 1). The default value circuitry 130 may be included in any layer of the chip and may provide the default value to multiple selector circuitries as shown in FIG. 1A. The selector circuitry 120 includes a second open and makeable (also called "normally open" herein) connection 126 between tie cell circuitry 124 and the gate circuitry 150. The tie cell circuitry 124 is configured to generate an opposite input value with respect to the default input value (e.g., either 1 or 0). The term "makeable" means that the connection 126 between the tie cell circuitry 124 and the gate circuitry 150 can be created by changing only the layer in which the selector circuitry 120 resides.

Figure 1B:
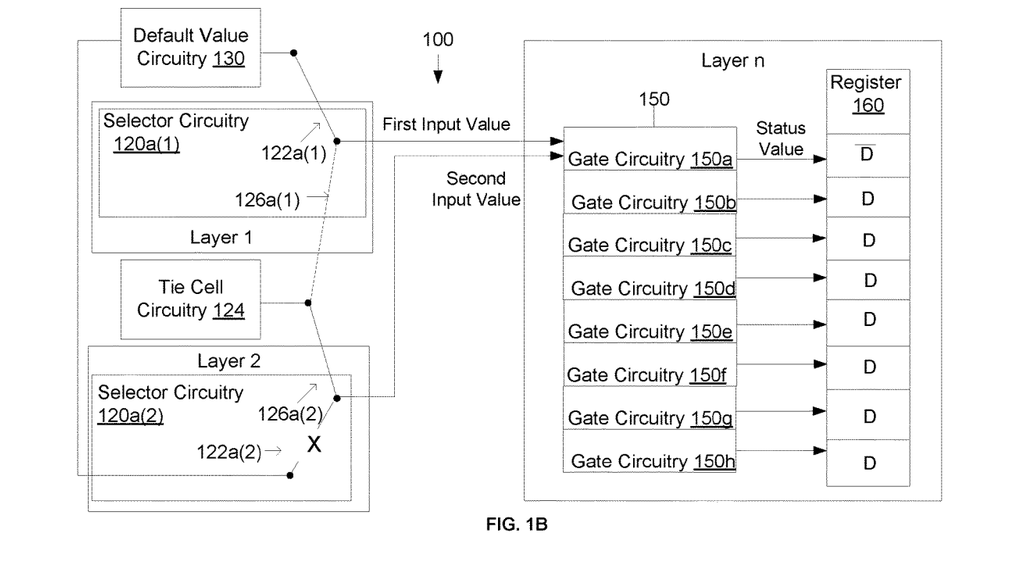

If a first functional change is made to the chip involving features in layer 1, the selector circuitry 120a(1) on layer 1 is used to change first status bit generated by the gate circuitry 150a. In FIG. 1B, the first connection 122a(1) of the first selector circuitry 120a(1) is open while the second connection 126a(1) has been made. In this manner, the opposite input value generated by the tie cell circuitry 124 is supplied to the gate circuitry 150a. The first connection 122a(2) of the second selector circuitry 120a(2) remains closed. In response to the change in the first input value, the gate circuitry 150a generates an opposite status bit value DNOT for the first status bit in the status register 160. Thus, the first status bit value is changed without any change to any other layer of the chip 100.

For simplicity, only three of the n layers are illustrated in FIG. 1A and FIG. 1B. Of course, any number of layers may be present in the chip 100 and any subset of the layers may participate in the versioning scheme described herein. While gate circuitry 150 and register circuitry 160 are illustrated as included in layer n, the gate circuitry 150 and the register circuitry 160 may be present on any layer, including layer 1 or layer 2. Further, each layer includes selector circuitry 120a-120h for each of the eight bits in the status register 160, however only selector circuitries 120a associated with the first bit are shown in FIG. 1A and FIG. 1B.

Figure 2A:
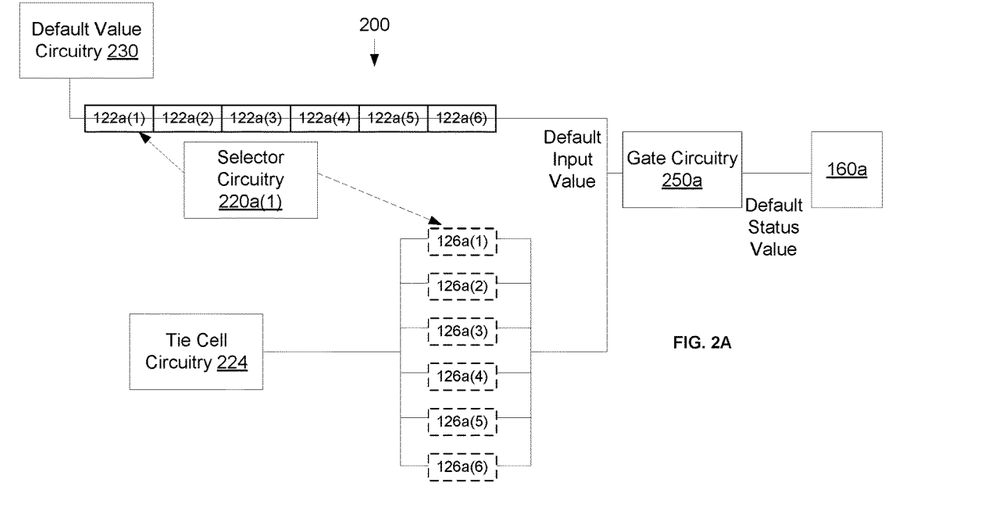
FIGS. 2A and 2B illustrate one example embodiment of versioning system of FIG. 1.
Figure 2B:
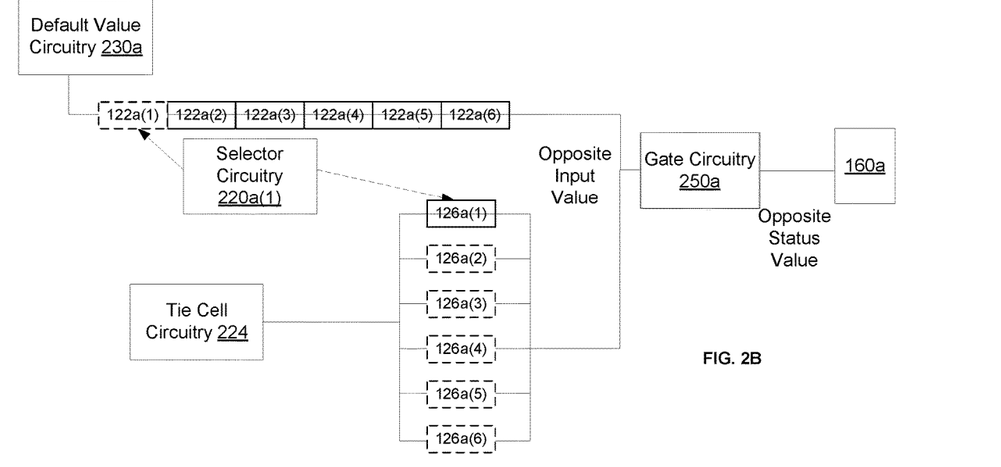

FIG. 2A and FIG. 2B schematically illustrate one embodiment of selector circuitry 220a(1) in layer 1 as interconnected with other selector circuitries in other layers of the chip. The selector circuitry 220a(1) includes the first connection 122a(1) between default value circuitry 230 and gate circuitry 250a. The selector circuitry 220a(1) includes the second connection 126a(1) between tie cell circuitry 124 and the gate circuitry 250a. FIG. 2A illustrates the initial configuration of the selector circuitry 220a(1) in which the default input value is being provided to the gate circuitry 250a which is, in response, generating the default status value stored in the first status bit 160a. The first connection 122a(1) of selector circuitry 120a(1) is connected in series with the first connection 122a of the selector circuitries in other layers 2-6 of the chip. In contrast, the combination of the tie cell circuitry 224 and the second connection 126a(1) is connected in parallel with respect to the tie cell circuitry 224 and second connections 126a of the selector circuitries in other layers 2-6 of the chip.

In FIG. 2A all of the first connections 122a are intact (e.g., are in their initial condition) so that the default input value generated by the default value circuitry 230 is conducted to the gate circuitry 250a to generate the default status value. In FIG. 2B to record a change made in layer 1, the first connection 122a(1) is broken and the second connection 126a(1) is made. This means that the selector circuitry 120a(1) provides the opposite input value generated by the tie cell circuitry 124 to the gate circuitry 250a which, in response, generates an opposite status value. It can be seen that the status value was changed by a single selector circuitry 120a(1) on a single layer of the chip. If another layer had been changed, selector circuitry on the changed layer may have been used in the same way to change the status value. Each status bit value may record the occurrence of a single change. This is why several (e.g., eight in the example embodiment) status bits are stored in the status register 160. In this manner, one change per status bit may be recorded by the register 160. Of course, more or less status bits may be used. If a second change is made that involves a layer n of the chip, selector circuitry 120b(n) on the changed layer can be used to change the value of the second status bit in the status register 160b.

Figure 3:
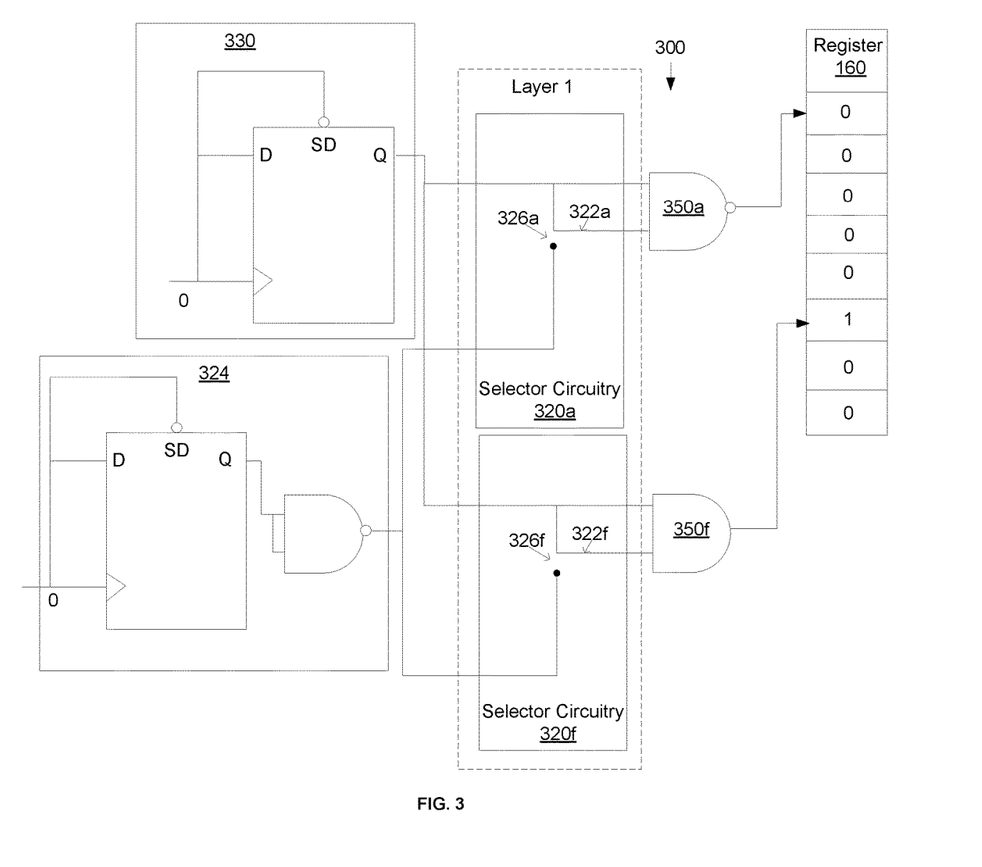
FIG. 3 illustrates one example embodiment of the versioning system of FIG. 1 in which different default status values are set.

FIG. 3 illustrates one embodiment of a versioning system 300 that allows different default status values to be used. In the example shown in FIG. 3, default circuitry 330 generates a default input value of 1. The default circuitry 330 includes a D flip flop to which a value of 0 is being provided to the input, the clock, and the reset pins. In response, the D flip flop outputs a constant value of 1. Gate circuitry 350a includes circuitry embodying a logical NAND operation while gate circuitry 350f includes circuitry embodying a logical AND operation. Other gate circuitries and selector circuitries for status bits b, c, d, e, g, and h are not shown for simplicity sake. The default value of 1 is provided to one input of both gate circuitries 350a, 350f regardless of selector circuitry status.

The tie cell circuitry 324 includes a D flip flop to which a value of 0 is being provided to the input, the clock, and the reset pins. In response, the D flip flop outputs a constant value of 1. The tie cell circuitry 324 includes circuitry embodying a logical NAND operation and the output of the D flip flop is provided to both inputs of the NAND gate. Thus, the output of the tie cell circuitry 324 will be a constant value of 0. To provide a tie cell that generates a constant value of 1, circuitry embodying a logical AND operation may replace the NAND circuitry of the tie cell circuitry 324.

In the initial configuration shown in FIG. 3, first connection 322a of selector circuitry 320a is intact so that the default input value of 1 is also provided to a second input of the gate circuitry 350a. Since gate circuitry 350a is a NAND gate, this will result in a status value of 0. The first connection 322f of selector circuitry 320f is also intact so that the default input value of 1 is also provided to a second input of the gate circuitry 350a. Since gate circuitry 350a is an AND gate, this will result in a status value of 1. In this manner, if it is desired for the default or initial status value of a given bit in the status register 160 to be a 1 instead of a 0, the type of logical operation performed by the gate circuitry 350 may be changed.

Figures 4, 5:
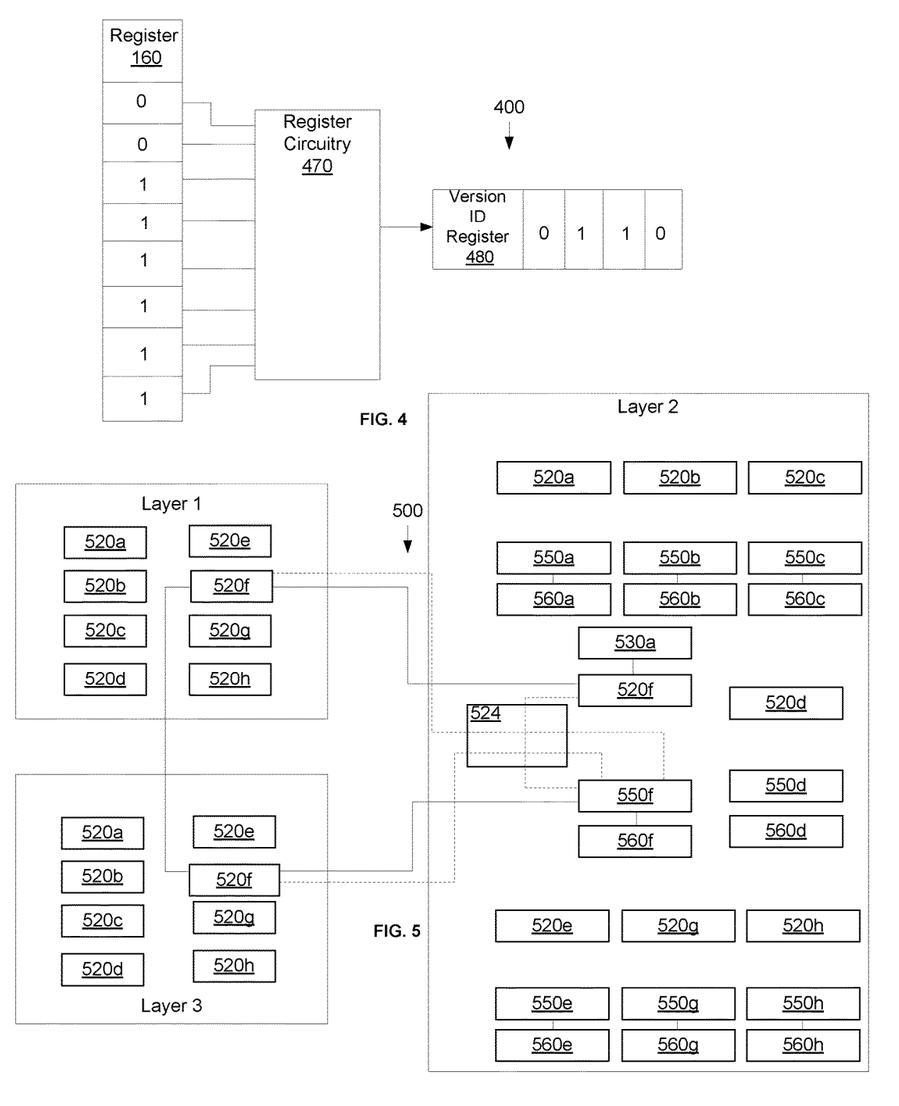
FIG. 4 illustrates one example embodiment of the versioning system of FIG. 1 including register circuitry configured to generate a version identifier.
FIG. 5 illustrates one example embodiment of the versioning system of FIG. 1 for a 3 layer device.

FIG. 4 illustrates one embodiment of a versioning system 400 in which the status bits in status register 160 are processed by register circuitry 470 to generate a version identifier that is stored in a version ID register 480. The status bits in the register 160 are used to create a lookup table in register transfer logic (RTL) using a priority encoder. This facilitates changing the version identifier with each chip change. In one embodiment, the register logic 470 is encoded in hardware, such as field gates. The register logic 470 maps each combination of status bits to a version identifier and stores the version identifier in the version ID register 480. One example RTL code that may be implemented by the register logic is as follows:

```
//
    assign one_hot_code=8'b00000000; //implement using tie
        cells
    ipdb_common_tie0_cell version_tie_7 (.out_o(one_hot-
        _code[7])));
    ipdb_common_tie0_cell version_tie_6 (.out_o(one_hot-
        _code[6])));
    ipdb_common_tie0_cell version_tie_5 (.out_o(one_hot-
        _code[5])));
    ipdb_common_tie0_cell version_tie_4 (.out_o(one_hot-
        _code[4])));
    ipdb_common_tie0_cell version_tie_3 (.out_o(one_hot-
        _code[3])));
    ipdb_common_tie0_cell version_tie_2 (.out_o(one_hot-
        _code[2])));
    ipdb_common_tie0_cell version_tie_1 (out_o(one_hot-
        _code[1])));
    ipdb_common_tie0_cell version_tie_0 (out_o(one_hot-
        _code[0])));
    always @ (one_hot_code)
    begin
    case (one_hot_code)
    8'b00000001:version_s=4'b0001;
    8'b00000011:version_s=4'b0010;
    8'b00000111:version_s=4'b0011;
    8'b00001111:version_s=4'b0100;
    840 b00011111:version_s=4'b0101;
    8'b00111111:version_s=4'b0110;
    8'b01111111:version_s=4'b0111;
    8'b11111111:version_s=4'b1111;
    default:version_s=4'b0000
    endcase
    end
```

FIG. 5 illustrates schematically, a chip 500 that includes three layers and one embodiment of selector circuitry 520 in each of the three layers. Recall that, for each bit in the register 560 the selector circuitry 520 includes a first connection that conducts a default value from default value circuitry 530 to gate circuitry 550. The selector circuitry 520 also includes a second connection that, when made, connects tie cell circuitry 524 to the gate circuitry 550. For simplicity sake, connections between the selector circuitry 520f associated with the sixth status bit in the register 560f is shown.

Similar connections are made as between selector circuitries 520a-520h in the layers. It can be seen in FIG. 5 that all layers of the chip 500 include selector circuitries 520f. However, only layer 2 includes default value circuitry 530, gate circuitry 550f, tie cell circuitry 524 and status register 560f. In the embodiment only a single default value circuitry 530 and a single tie cell circuitry 524 are used to generate status values for each of the eight registers 560a-560g. In other embodiments, multiple default value circuitries and/or tie cell circuitries may be provided such that each circuitry generates a status value for a subset of the registers 560.

When the chip is in its original version, the first connections in each of the selector circuitries 520 are connected. Since the first connections are in series wiwth one another, the default input value from default value circuitry 530f flows through all three selector circuitries to the gate circuitry 560f. This will result in the gate circuitry 560f generating a default status value that is stored in the status register 560f. The series connections are shown in solid line in FIG. 5. If a change is made on any layer, the first connection in the selector circuitry 520f on that layer (e.g., one of layers 1, 2, or 3) is severed so that the series path from the default value circuitry 530a to the gate circuitry 550f is broken.

The second connection in the selector circuitry (shown functionally as a dashed line connecting each selector circuitry 520f through the tie cell circuitry 524a and to the gate circuitry 550f) on that layer is made, thereby connecting the tie cell circuitry 524a to the gate circuitry 550f. The tie cell circuitry generates an opposite input value. Since the second connections in the selector circuitries are connected in parallel with one another, the opposite input value is now conducted to the gate circuitry by way of the dashed line connection between the layer and the gate circuitry 550f. In response to this opposite input value, the gate circuitry 550f will generate an opposite status value for the status register 560f.

Figure 6:
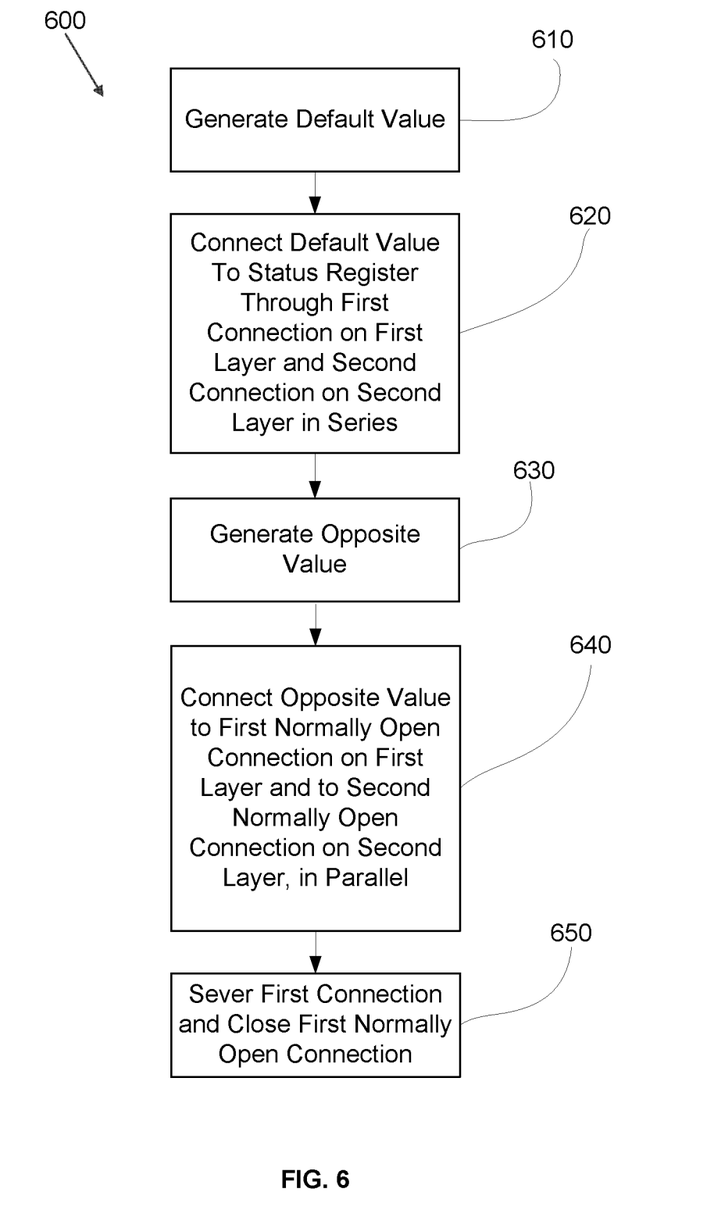
FIG. 6 illustrates a flow diagram outlining one example method for changing a version identifier from any one of multiple metal layers in a chip.

FIG. 6 illustrates one embodiment of a method 600 for changing a version identifier. The method 600 may be performed by the versioning systems 100, 200, 300, or 500 of FIGS. 1, 2, 3, and 5, respectively. The method includes, at 610, generating a default input value. At 620 the default input value is electrically connected through a first connection on a first layer of a semiconductor chip and a second connection on a second layer of the semiconductor chip to a status register. The first connection and the second connection are in series. At 640, the method includes generating an opposite input value that is opposite of the default value. At 650, the opposite input value is electrically connected to a first normally open connection with the status register on the first layer and also to a second normally open connection with the status register on the second layer. The first normally open connection and the second open connection are in parallel with respect to one another. At 660, the method includes severing the first connection on the first layer closing the first normally open connection on the first layer, such that the opposite input value is conducted through the first open connection to the status register and the version identifier is changed.

It can be seen from the foregoing description that the version identifier of a chip may be changed from any layer on the chip. Thus, the version identifier may be changed using selector circuitry provided on the layer that includes the revised features. This reduces the cost and complexity involved in changing the version identifier because a change to a separate metal layer that generates the version identifier is no longer necessary.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Example 1 is version circuitry for use with a semiconductor chip having multiple layers. The version circuitry includes a status register configured to store a plurality of status bits. The version circuitry includes, associated with each bit in the plurality of status bits, gate circuitry, first selector circuitry and second selector circuitry. The gate is circuitry configured to generate an input value for the status bit based at least on a first input and a second input. The first selector circuitry is in a first layer of the multiple layers. The first selector circuitry is coupled to the gate circuitry and is configured to select an input value for the first input. The second selector circuitry is in a second layer of the multiple layers. The second selector circuitry is coupled to the gate circuitry and is configured to select an input value for the second input. The gate circuitry is configured to generate a default value for the status bit when the first input and the second input each have a default value and generate an opposite value for the status bit when either the first input or the second input has an opposite value.

Example 2 includes the subject matter of example 1, including or omitting optional elements, further including register circuitry configured to: receive the plurality of status bits; convert the plurality of status bits to a version number; and store the version number in a version identification register.

Example 3 includes the subject matter of example 1, including or omitting optional elements, further including default value circuitry on one of the layers of the multiple layers configured to generate the default value for the first input value and the second input value; and tie cell circuitry on one of the layers that generates an opposite input value that is the opposite of the default value.

Example 4 includes the subject matter of examples 1-3, including or omitting optional elements, wherein the first and second selector circuitry include a severable first connection between the gate circuitry and the default value circuitry and a normally open second connection between the gate circuitry and the tie cell circuitry. The first selector circuitry and the second selector circuitry are initially configured with the first connection made and the second connection open such that the gate circuitry generates a default status value for the status bit. When the first connection is severed and the second connection is made in either of the first selector circuitry or the second selector circuitry, the gate circuitry will generate an opposite status value for the status bit.

Example 5 includes the subject matter of example 4, including or omitting optional elements, wherein the gate circuitry comprises circuitry embodying a logical NAND operation; and the default input value is one; such that default status value is zero.

Example 6 includes the subject matter of example 4, including or omitting optional elements, wherein the gate circuitry comprises circuitry embodying a logical AND operation; and the default input value is one; and such that default status value is one.

Example 7 includes the subject matter of example 4, including or omitting optional elements, wherein the first connection in the first selector circuitry and the first connection in the second selector circuitry are connected to one another in series between the default value circuitry and the gate circuitry; and the second connection in the first selector circuitry and the second connection in the second selector circuitry are each connected between the tie cell circuitry and the gate circuitry such that either the second connection in the first selector circuitry or the second connection in the second selector circuitry is capable of completing an electrical path between the tie cell circuitry and the gate circuitry.

Example 8 includes the subject matter of example 1, including or omitting optional elements, wherein the gate circuitry and the first register are in a different layer of the chip than the first layer and the second layer.

Example 9 is a method, including generating a default input value; electrically connecting the default input value through a first connection on a first layer of a semiconductor chip and a second connection on a second layer of the semiconductor chip to a status register, such that the first connection and the second connection are in series; generating an opposite input value from the default value; electrically connecting the opposite input value to a first normally open connection with the status register on the first layer; electrically connecting the opposite input value to a second normally open connection with the status register on the second layer, such that the first normally open connection and the second open connection are in parallel with respect to one another; severing the first connection on the first layer; closing the first normally open connection on the first layer, such that the opposite input value is conducted through the first open connection to the status register.

Example 10 includes the subject matter of example 9, including or omitting optional elements, including generating the default input value with circuitry disposed on a third layer of the semiconductor chip.

Example 11 includes the subject matter of example 9, including or omitting optional elements, including generating the opposite input value with circuitry disposed on a third layer of the semiconductor chip.

Example 12 includes the subject matter of example 9, including or omitting optional elements, further including receiving a plurality of status bits from a plurality of status registers; converting the plurality of status bits to a version number; and storing the version number in a version identification register.

Example 13 includes the subject matter of examples 9-12, including or omitting optional elements, including receiving the status bits from the plurality of status registers disposed on a third layer of the semiconductor chip.

Example 14 includes the subject matter of examples 9-12, including or omitting optional elements, including storing the version number in the version identification register disposed on a third layer of the semiconductor chip.

Example 15 is a versioning system, including default value circuitry configured to generate a default input value and first selector circuitry on a first layer of a semiconductor chip configured to connect the default input value through a first connection on the first layer to second selector circuitry on a second layer of the semiconductor chip. The second selector circuitry is configured to connect the default input value from the first connection on the first layer through a second connection on the second layer to a status register, such that the first connection and the second connection are in series. Tie cell circuitry is configured to generate an opposite input value from the default input value. The first selector circuitry is configured to electrically connect the opposite input value to a first normally open connection with the status register on the first layer and the second selector circuitry is configured to electrically connect the opposite input value to a second normally open connection with the status register on the second layer, such that the first normally open connection and the second open connection are in parallel with respect to one another. In response to a change on the first layer, the first selector circuitry is adapted for severing of the first connection on the first layer and closing of the first normally open connection on the first layer, such that the opposite input value is conducted through the first normally open connection to the status register.

Example 16 includes the subject matter of example 15, including or omitting optional elements, wherein the default value circuitry is disposed on a third layer of the semiconductor chip.

Example 17 includes the subject matter of example 15, including or omitting optional elements, wherein the opposite value circuitry is disposed on a third layer of the semiconductor chip.

Example 18 includes the subject matter of example 15, including or omitting optional elements, including register circuitry configured to receive a plurality of status bits from a plurality of status registers; convert the plurality of status bits to a version number; and store the version number in a version identification register.

Example 19 includes the subject matter of examples 15-18, including or omitting optional elements, wherein the plurality of status registers are disposed on a third layer of the semiconductor chip.

Example 20 includes the subject matter of examples 15-18, including or omitting optional elements, wherein the version identification register is disposed on a third layer of the semiconductor chip.

Example 21 is an apparatus for use with a semiconductor chip having multiple layers. The apparatus includes means for generating a default input value; means for connecting the default input value through a a first layer to a second a second layer; and means for connecting the default input value from the first layer through the second connection to a status register, such that the first connection and the second connection are in series. The apparatus includes means for generating an opposite input value from the default input value; means for connecting the opposite input value to a first normally open connection with the status register on the first layer; and means for connecting the opposite input value to a second normally open connection with the status register on the second layer, such that the first normally open connection and the second open connection are in parallel with respect to one another. The apparatus includes means for severing the first connection on the first layer and closing the first normally open connection on the first layer, such that the opposite value is conducted through the first normally open connection to the status register.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. Version circuitry for use with a semiconductor chip having multiple layers, the version circuitry comprising:
    a status register configured to store a plurality of status bits;
    associated with each bit in the plurality of status bits:
        gate circuitry configured to generate a value for the status bit based at least on a first input and a second input; and
        first selector circuitry in a first layer of the multiple layers, wherein the first selector circuitry is coupled to the gate circuitry and is configured to select an input value for the first input;
        second selector circuitry in a second layer of the multiple layers, wherein the second selector circuitry is coupled to the gate circuitry and is configured to select an input value for the second input;
    wherein the gate circuitry is configured to:
        generate a default value for the status bit when the first input and the second input each have a default value; and
        generate an opposite value for the status bit when either the first input or the second input has an opposite value.

2. The version circuitry of claim 1, further comprising register circuitry configured to:
    receive the plurality of status bits;
    convert the plurality of status bits to a version number; and
    store the version number in a version identification register.

3. The version circuitry of claim 1, further comprising:
    default value circuitry on one of the layers of the multiple layers configured to generate the default value for the first input value and the second input value; and tie cell circuitry on one of the layers that generates an opposite input value that is the opposite of the default value.

4. The version circuitry of claim 3, wherein the first selector circuitry and the second selector circuitry each comprise:
a severable first connection between the gate circuitry and the default value circuitry;
a normally open second connection between the gate circuitry and the tie cell circuitry;
wherein the first selector circuitry and the second selector circuitry are initially configured with the first connection made and the second connection open such that the gate circuitry generates a default status value for the status bit,
further wherein when the first connection is severed and the second connection is made in either of the first selector circuitry or the second selector circuitry, the gate circuitry will generate an opposite status value for the status bit.

5. The version circuitry of claim 4, wherein:
the gate circuitry comprises circuitry embodying a logical NAND operation; and
the default input value is one to set the default status value to zero.

6. The version circuitry of claim 4, wherein:
the gate circuitry comprises circuitry embodying a logical AND operation; and
the default input value is one to set the default status value to one.

7. The version circuitry of claim 4, wherein:
the first connection in the first selector circuitry and the first connection in the second selector circuitry are connected to one another in series between the default value circuitry and the gate circuitry; and
the second connection in the first selector circuitry and the second connection in the second selector circuitry are each connected between the tie cell circuitry and the gate circuitry such that either the second connection in the first selector circuitry or the second connection in the second selector circuitry is capable of completing an electrical path between the tie cell circuitry and the gate circuitry.

8. The version circuitry of claim 1, wherein the gate circuitry and the status register are in a different layer of the chip than the first layer and the second layer.

9. A method, comprising:
generating a default input value;
electrically connecting the default input value through a first connection on a first layer of a semiconductor chip and a second connection on a second layer of the semiconductor chip to a status register, such that the first connection and the second connection are in series;
generating an opposite input value that is opposite of the default value;
electrically connecting the opposite input value to a first normally open connection with the status register;
electrically connecting the opposite input value to a second normally open connection with the status register, such that the first normally open connection and the second normally open connection are in parallel with respect to one another;
severing the first connection on the first layer;
closing the first normally open connection on the first layer, such that the opposite input value is conducted through the first normally open connection to the status register.

10. The method of claim 9, comprising generating the default input value with circuitry disposed on a third layer of the semiconductor chip.

11. The method of claim 9, comprising generating the opposite input value with circuitry disposed on a third layer of the semiconductor chip.

12. The method of claim 9, further comprising:
receiving a plurality of status bits from a plurality of status registers;
converting the plurality of status bits to a version number; and
storing the version number in a version identification register.

13. The method of claim 12, comprising receiving the status bits from the plurality of status registers disposed on a third layer of the semiconductor chip.

14. The method of claim 12, comprising storing the version number in the version identification register disposed on a third layer of the semiconductor chip.

15. A versioning system, comprising:
default value circuitry configured to generate a default input value;
first selector circuitry on a first layer of a semiconductor chip configured to connect the default input value through a first connection on the first layer to second selector circuitry on a second layer of the semiconductor chip;
wherein the second selector circuitry is configured to connect the default input value from the first connection on the first layer through a second connection on the second layer to a status register, such that the first connection and the second connection are in series;
tie cell circuitry configured to generate an opposite input value that is opposite of the default input value;
wherein the first selector circuitry is configured to electrically connect the opposite input value to a first normally open connection with the status register;
wherein the second selector circuitry is configured to electrically connect the opposite input value to a second normally open connection with the status register, such that the first normally open connection and the second normally open connection are in parallel with respect to one another;
wherein, in response to a change on the first layer, the first selector circuitry is adapted for severing of the first connection on the first layer and closing of the first normally open connection on the first layer, such that the opposite input value is conducted through the first normally open connection to the status register.

16. The versioning system of claim 15, wherein the default value circuitry is disposed on a third layer of the semiconductor chip.

17. The versioning system of claim 15, wherein the tie cell circuitry is disposed on a third layer of the semiconductor chip.

18. The versioning system of claim 15, further comprising register circuitry configured to:
receive a plurality of status bits from a plurality of status registers;
convert the plurality of status bits to a version number; and
store the version number in a version identification register.

19. The versioning system of claim 18, wherein the plurality of status registers are disposed on a third layer of the semiconductor chip.

20. The versioning system of claim 18, wherein the version identification register is disposed on a third layer of the semiconductor chip.

* * * * *